United States Patent
McGhee et al.

(10) Patent No.: US 6,581,193 B1
(45) Date of Patent: Jun. 17, 2003

(54) APPARATUS AND METHODS FOR MODELING PROCESS EFFECTS AND IMAGING EFFECTS IN SCANNING ELECTRON MICROSCOPY

(75) Inventors: Ridge C. McGhee, Atherton, CA (US); Mohan Ananthanarayanan, San Jose, CA (US); Robert A. Watts, Folsom, CA (US)

(73) Assignee: KLA-Tencor, San Jose, CA (US)

( * ) Notice: Subject to any disclaimer, the term of this patent is extended or adjusted under 35 U.S.C. 154(b) by 0 days.

(21) Appl. No.: 09/881,451

(22) Filed: Jun. 13, 2001

(51) Int. Cl.⁷ .............................................. G06F 17/50
(52) U.S. Cl. ........................................... 716/4; 716/21
(58) Field of Search ........................... 716/1, 4, 17, 18, 716/21

(56) References Cited

U.S. PATENT DOCUMENTS

| | | | |
|---|---|---|---|
| 4,442,361 A | 4/1984 | Zasio et al. ............... 250/491.1 |
| 4,890,239 A | * 12/1989 | Ausschnitt et al. ........... 716/21 |
| 5,124,927 A | * 6/1992 | Hopewell et al. ............. 716/21 |
| 5,153,678 A | 10/1992 | Ota ............................ 356/401 |
| 5,444,538 A | 8/1995 | Pellegrini .................... 356/401 |
| 5,648,854 A | 7/1997 | McCoy et al. .............. 356/399 |
| 5,654,540 A | 8/1997 | Stanton et al. .............. 250/237 |
| 5,657,129 A | 8/1997 | Nishi .......................... 356/401 |
| 5,754,299 A | 5/1998 | Sugaya et al. ............... 356/401 |
| 5,757,480 A | 5/1998 | Shimanaka .................. 356/237 |
| 5,920,398 A | 7/1999 | Iwanaga et al. ............. 356/401 |
| 5,989,759 A | 11/1999 | Ando et al. .................... 430/22 |
| 5,995,234 A | 11/1999 | Nishi .......................... 356/401 |
| 6,064,486 A | 5/2000 | Chen et al. .................. 356/401 |
| 6,100,985 A | 8/2000 | Scheiner et al. ............ 356/381 |
| 6,141,108 A | 10/2000 | Kida .......................... 356/401 |
| 6,298,470 B1 | * 10/2001 | Breiner et al. .................. 716/4 |
| 6,304,999 B1 | * 10/2001 | Toprac et al. ................... 716/4 |

* cited by examiner

*Primary Examiner*—Trong Phan
(74) *Attorney, Agent, or Firm*—Beyer, Weaver &Thomas, LLP.; Mary R. Olynick, Esq.

(57) ABSTRACT

Disclosed are methods and apparatus for generating a test recipe for a metrology tool is disclosed. A plurality of first reference images that are designed to be used to fabricate a plurality of structures on a sample are provided. Each structure is imageable to form a plurality of target image patterns. A test recipe for use by a metrology tool in locating the structures on the sample is generated or modified. Generating or modifying the test recipe includes forming a plurality of second references images from the first reference images and associating the second reference images with the test recipe. The second reference images are formed to at least partially simulate one or more process effect(s) associated with fabricating the structures of the sample. Additionally, the second reference images may also be formed to simulate one or more imaging effects.

32 Claims, 11 Drawing Sheets

Figure 8A

| 0 | 0 | 0 | 0 | 0 |
|---|---|---|---|---|
| 0 | 0 | 0 | 0 | 0 |
| 0 | 0 | 255 | 255 | 255 |
| 0 | 0 | 255 | 255 | 255 |
| 0 | 0 | 255 | 255 | 255 |

| 128 | 128 | 128 | 0 | 128 |
|---|---|---|---|---|
| 128 | 255 | 255 | 255 | 255 |
| 128 | 255 | 255 | 255 | 255 |
| 128 | 255 | 255 | 128 | 128 |
| 128 | 255 | 255 | 128 | 128 |

| 0 | 0 | 0 | 0 | 0 |
|---|---|---|---|---|
| 0 | 255 | 255 | 255 | 255 |
| 0 | 255 | 255 | 255 | 255 |
| 0 | 255 | 255 | 150 | 150 |
| 0 | 255 | 255 | 150 | 150 |

802b    804b    806c

| 255 | 0 | 0 | 0 | 0 | 0 | 0 |
| --- | --- | --- | --- | --- | --- | --- |
| 255 | 0 | 0 | 0 | 0 | 0 | 0 |
| 255 | 0 | 0 | 0 | 0 | 0 | 0 |
| 255 | 0 | 0 | 0 | 0 | 0 | 0 |

Figure 9A

| 255 | 213 | 170 | 128 | 85 | 43 | 0 |
| --- | --- | --- | --- | --- | --- | --- |
| 255 | 213 | 170 | 128 | 85 | 43 | 0 |
| 255 | 213 | 170 | 128 | 85 | 43 | 0 |
| 255 | 213 | 170 | 128 | 85 | 43 | 0 |
| ↑ | ↑ | ↑ | ↑ | ↑ | ↑ | ↑ |
| 902 | 904b | 906b | 908b | 910b | 912b | 914b |

APPARATUS AND METHODS FOR MODELING PROCESS EFFECTS AND IMAGING EFFECTS IN SCANNING ELECTRON MICROSCOPY

BACKGROUND OF THE INVENTION

The present invention relates generally to reticle and integrated circuit design and fabrication systems. More specifically, the invention relates to mechanisms for generating and inspecting reticles and integrated circuits.

Generation of reticles and subsequent optical inspection of such reticles have become standard steps in the production of semiconductors. Initially, circuit designers provide circuit pattern data, which describes a particular integrated circuit (IC) design, to a reticle production system, or reticle writer. The circuit pattern data is typically in the form of a representational layout of the physical layers of the fabricated IC device. The representational layout typically includes a representational layer for each physical layer of the IC device (e.g., gate oxide, polysilicon, metallization, etc.), wherein each representational layer is composed of a plurality of polygons that define a layer's patterning of the particular IC device.

The reticle writer uses the circuit pattern data to write (e.g., typically, an electron beam writer or laser scanner is used to expose a reticle pattern) a plurality of reticles that will later be used to fabricate the particular IC design. A reticle inspection system may then inspect the reticle for defects that may have occurred during the production of the reticles.

A reticle or photomask is an optical element containing transparent and opaque, semi-transparent, and phase shifting regions which together define the pattern of coplanar features in an electronic device such as an integrated circuit. Reticles are used during photolithography to define specified regions of a semiconductor wafer for etching, ion implantation, or other fabrication processes. For many modern integrated circuit designs, an optical reticle's features are between about 1 and about 5 times larger than the corresponding features on the wafer. For other exposure systems (e.g., x-ray, e-beam, and extreme ultraviolet) a similar range of reduction ratios also apply.

Optical reticles are typically made from a transparent medium such as a borosilicate glass or quartz plate on which is deposited on an opaque and/or semi-opaque layer of chromium or other suitable material. However, other mask technologies are employed for direct e-beam exposure (e.g., stencil masks), x-ray exposure (e.g., absorber masks), etc. The reticle pattern may be created by a laser or an e-beam direct write technique, for example, both of which are widely used in the art.

After fabrication of each reticle or group of reticles, each reticle is typically inspected by illuminating it with light emanating from a controlled illuminator. An optical image of the reticle is constructed based on the portion of the light reflected, transmitted, or otherwise directed to a light sensor. Another way to inspect a reticle is accomplished by directing a beam of electrons from a scanning electron microscope towards the reticle. An image of the reticle is constructed based on secondary and backscattered electrons emitted from the reticle in response to the beam of electron towards a detector. Such inspection techniques and apparatus are well known in the art and are embodied in various commercial products such as many of those available from KLA-Tencor Corporation of San Jose, Calif.

During a conventional inspection process, a target image of a test structure on the reticle is typically compared to a reference image. The reference image is either generated from the circuit pattern data or from an adjacent die on the reticle itself. Either way, the target image features are analyzed and compared with corresponding features of the reference image. Each feature difference is then compared against a threshold value. If the target image feature varies from the reference feature by more than the predetermined threshold, a defect is defined. Similar techniques may be utilized to inspect an integrated circuit (IC).

Prior to comparing a target image to its corresponding reference image, the target image which corresponds to the reference image must be accurately located. Conventionally, the corresponding target image is located manually by first locating a unique target image that is adjacent to the target image of the test structure to be tested. The unique image is typically located by searching for an imaged target pattern from the sample that most closely matches a unique reference pattern selected from the original design data. The location of the reference pattern can then be used to form a frame of reference for the subsequent inspection or metrology.

Although conventional reticle and IC inspections provide adequate searching mechanisms under some conditions, the searching mechanisms fail when the unique target images significantly differ from their corresponding unique reference images. Several different effects may contribute to the target images differing from the reference images. When the target structures are fabricated from original design patterns which are also used as the reference images, the fabrication process itself introduces discrepancies between the target structures and the reference images. By way of examples, the target structures may become tapered and reduced in size. Target structure corners may also become rounded and/or warped, while edges may become roughened. Imaging of target structures also introduces discrepancies between the reference and target images. The imaging process may result in edge enhancement, scan persistence, and contrast changes between the substrate and material, as compared with the design patterns (reference images). Edges may also appear thickened and charge shadowing may occur. These differences between the target and reference images often make it very difficult to locate a target image which corresponds to a particular reference image.

Accordingly, there is a need for improved mechanisms for providing reference images for locating corresponding target images. Additionally, there is a need for reduction in the discrepancies between the reference and corresponding target images caused by process and/or imaging effects resulting from fabricating and imaging of the corresponding test structures.

SUMMARY OF THE INVENTION

Accordingly, mechanisms are provided for generating reference images (or modifying existing reference images) so that the reference images at least partially simulate one or more process effects. In one specific implementation, the reference images simulate feature tapering, corner rounding, and feature shrinkage, which effects are typically introduced during fabrications of the corresponding target structures. Additional mechanisms are provided for generating or modifying reference images so that they at least partially simulate imaging effects. In a specific embodiment, simulated imaging effects include edge enhancement, substrate and material contrast, and scan persistence.

The reference images may then be utilized to locate target images of patterns on a sample, such as a reticle or integrated circuit. In one embodiment, a recipe is formed based on the simulated reference images. The recipe is configured to be used by a metrology tool to automatically locate corresponding target structures on a sample. In this application, the recipe includes information associated with each reference image that specifies the kind of test to be performed on a test structure that is located proximate to the target structures. For example, the information includes an offset distance from such target structure to such test structure and the type of test structure to be measured. In one implementation, the information specifies whether the structure to be measured is a line, trench, hole, or post. The information preferably also specifies whether to measure from outer most edge to outer most edge of such structure or inner most edge to inner most edge.

In a specific embodiment, a method of generating a test recipe for a metrology tool is disclosed. A plurality of first reference images that are designed to be used to fabricate a plurality of structures on a sample are provided. Each structure is imageable to form a plurality of target image patterns. A test recipe for use by a metrology tool in locating the structures on the sample is generated or modified. Generating or modifying the test recipe includes forming a plurality of second references images from at least some of the first reference images and associating the second reference images with the test recipe. The second reference images are formed to at least partially simulate one or more process effect(s) associated with fabricating the structures of the sample.

In a preferred implementation, each simulated process effect and simulated imaging effect are associated with a degree parameter having a plurality of selectable values. Each degree parameter value corresponds to a specific amount of the associated simulated process effect or imaging effect. For a particular process type and a particular type of metrology tool, combinations of different degree parameter values are analyzed for each processing and imaging effect to determine which combination most accurately simulates the process and imaging effects of the particular process type and the particular type of metrology tool, respectively. In a specific aspect, the analysis is accomplished by analyzing combinations of different degree parameter values for each processing effect to determine which combination most accurately simulates the process effect of the particular process type and separately analyzing combinations of different degree parameter values for each imaging effect to determine which combination most accurately simulates the imaging effect of the particular metrology tool.

In various applications of the invention, the metrology tool is a scanning electron microscope designed to measure and/or inspect samples. The samples may include, but are not limited to, a reticle and an integrated circuit. The structures include, but are not limited to, integrated circuit structures, resist pattern structures utilizable for fabricating integrated circuit structures, reticle structures, and resist pattern structures utilizable for fabricating reticle structures. In another embodiment, locating the structures on the sample is accomplished by a pixel based search. In yet another embodiment, locating the structures on the sample is accomplished by finding a first structure on the sample that is significantly correlated with a first one of the second reference images. In another aspect, locating the structures on the sample is accomplished by a feature-based search.

In another aspect, the invention pertains to a computer system operable to generate a test recipe for a metrology tool. The computer system includes one or more processors and one or more memory. At least one of the processors and memory are adapted to perform one or more of the above described inventive procedures. In yet another aspect, the invention pertains to a computer program product for generating a test recipe for a metrology tool. The computer program product includes at least one computer readable medium and computer program instructions stored within the at least one computer readable product configured to cause a combining device to perform one or more of the above described inventive procedures.

These and other features and advantages of the present invention will be presented in more detail in the following specification of the invention and the accompanying figures which illustrate by way of example the principles of the invention.

BRIEF DESCRIPTION OF THE DRAWINGS

FIGS. 8A through 8C illustrate simulation of edge enhancement and substrate and material contrast shifting, in accordance with one embodiment of the present invention.

FIGS. 9A and 9B show simulation of scan persistence in accordance with one embodiment of the present invention.

DETAILED DESCRIPTION OF SPECIFIC EMBODIMENTS

Figure 1:
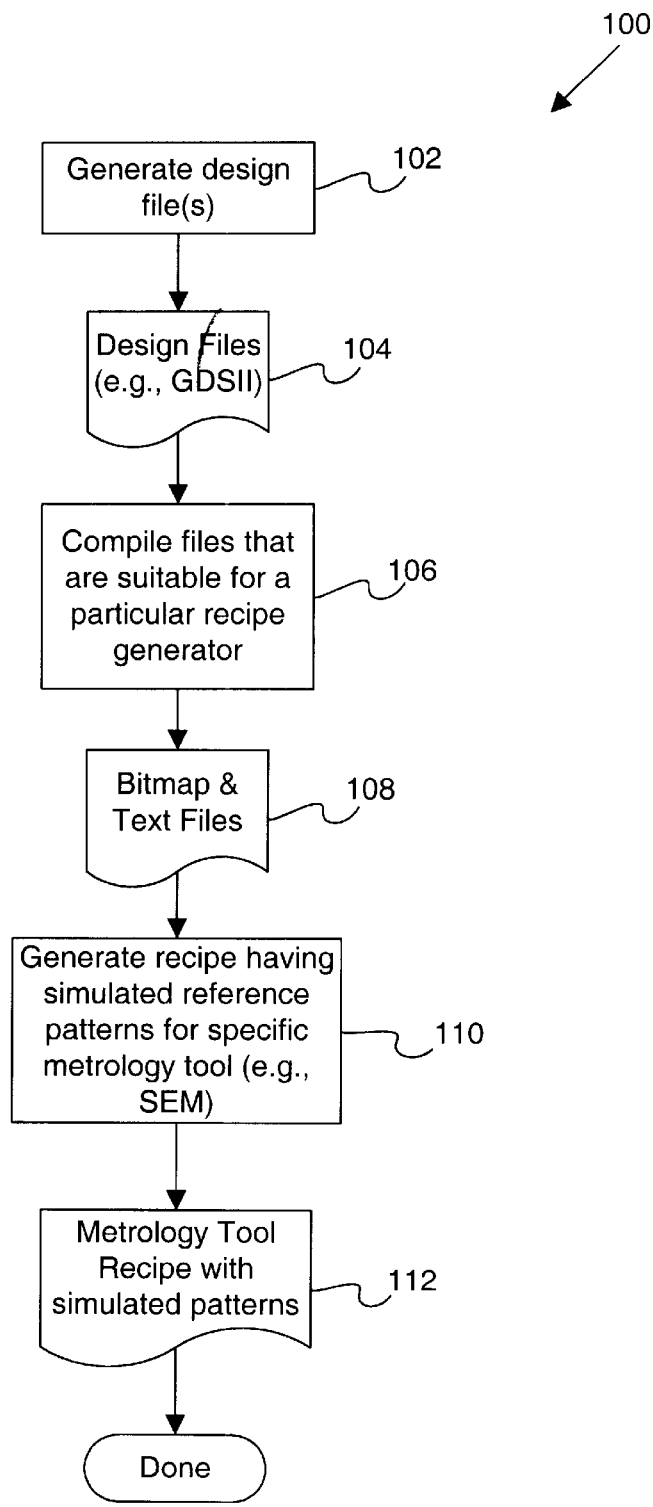
FIG. 1 is a flowchart illustrating a procedure for generating a metrology tool recipe having simulated reference images in accordance with one embodiment of the present invention.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In general terms, a test recipe is generated while taking into account one or more process effects and/or imaging effects. The recipe is designed for use by a metrology tool which is configured to locate and measure and/or inspect structures on a particular sample, such as a reticle or integrated circuit (IC). The reticle or IC may contain test structures, as well as other types of structures. By way of examples, the structures may include unique structures that may be used to locate the test structures and structures that are not used during a test of such reticle or IC.

The recipe includes reference images that correspond to at least some of the structures (herein referred to as target structures) on the sample. Each reference image is altered from the original design feature to simulate one or more process effects that occur on the corresponding target structure during fabrication of the target structure from the original design image. That is, the process effects result in differences between the target structure and its intended design. For example, corners are rounded. The reference images may also be altered from the original design features to simulate imaging effects introduced during imaging of the corresponding target structures. In brief, the imaging effects result in the target image differing from the target structure being imaged. When target structures are imaged with a scanning electron microscope, for example, the act of forming a target image from the target structure introduces imaging effects such as edge enhancement, scan persistence, and substrate and material contrast shifting into the resulting target images.

The test recipe may be configured to associate each reference image with information as to test structure type and/or measurement type. For instance, the structure type may specify a line or a trench, and the measurement type may specify whether a measurement is taken between the inside or outside edges of the line or trench. Alternatively, the structure type may not be specified when a single structure type is contemplated for the particular test. Likewise, the measurement type may not be specified when a single measurement type is used.

These simulated reference images may then be used to accurately locate corresponding images of target structures on a sample during imaging of such sample. Once a corresponding target image is located, a measurement (e.g., gate width) of the found target image or another target image located proximate to the initially found target image may then be taken and compared to a measurement of a reference image (e.g., a reference image derived from the design database that corresponds to the target image being tested or an adjacent die image). The target pattern is used by pattern recognition software, for example, to locate a target structure that is proximate to the actual test structure. Alternatively, the target structure may be the test structure itself.

FIG. 1 is a flowchart illustrating a procedure 100 for generating a metrology tool recipe having simulated reference images in accordance with one embodiment of the present invention. Initially, one or more electronic design file(s) that represent a particular integrated circuit (IC) design are generated in operation 102. These design file(s) may be in any suitable format. By way of specific examples, the design files may have a GDSII format or MEBES™ format available from ETEC, a division of Applied Materials of Sunnyvale, Calif.

Any suitable design techniques may be used to generate the design files. In one common technique, an IC designer uses preexisting schematic library blocks to form the IC device using, for example, electronic design automation (EDA) tools. In some cases, the IC designer may create the IC device or part of the IC device from scratch with the aid of any suitable design system, such as conventional computer aided design (CAD) tools. For instance, the IC designer may use a schematic CAD tool to plan the logic diagrams for a particular IC device. Still further, the IC designer may write a description of the IC device or portions of the IC device with the aid of a hardware design language, such as VHDL (Verilog Hardware Description Language).

Next, the IC designer generates a circuit pattern database (commonly referred to as a "layout") from the IC design. The circuit pattern database is composed of a plurality of electronic representations of layout patterns for IC layers that are later converted into a plurality of reticles that are used to fabricate a plurality of physical layers of an IC device. Each physical layer of the fabricated IC device corresponds to one of the reticles and an associated one of the electronic representations of the circuit pattern database. For example, one electronic representation may correspond to a diffusion pattern on a silicon substrate, another to a gate oxide pattern, another to a gate polysilicon pattern, another to a contact pattern on an interlayer dielectric, another to a line pattern on a metallization layer, and so on. Each electronic representation is composed of a plurality of polygons or other shapes, which together define the reticle pattern.

The circuit pattern database (referred to herein as design files) may be generated using any suitable technique, for example, by using EDA or CAD tools. In one technique, the IC designer may manually lay out the circuit patterns for the IC device with or without preexisting library cells. Alternatively, a synthesis tool may automatically create circuit patterns for the IC device from scratch or by piecing together preexisting library cells.

The design files 104 are then used to compile files 108 that are suitable for a particular recipe generator in operation 106. In one implementation, the design files are presented graphically to an operator so that the operator may select unique reference patterns that may later be used to locate a target pattern that is proximate to the test structure itself. In a specific implementation, files suitable for specific recipe generators, as well as files suitable for specific fabrication protocols, may be generated using CATS™ software available from Transcription Enterprises, a division of Numerical Technologies of Los Gatos, Calif.

This operation of generating a recipe may also include graphically "marking" test structures. The marks indicate a specific measurement type on a specific test structure. The measurement type may correspond to a specific threshold value that the measurement of the test structure is required to not exceed. In other words, the threshold value for particular measurement types may be selectable. For example, a lower threshold may be used for critical dimension measurements, as compared to interconnect thickness measurements. Several embodiments of marking techniques are described in U.S. patent application Ser. No. 09/213,744, filed Dec. 17, 1998, by Glasser et al., entitled Mechanisms for Making and Inspecting Reticles, which application is incorporated herein by reference for all purposes.

In one embodiment, the resulting files 108 include bitmaps of unique target structures that may be located prior to testing proximate test structures. The resulting files 108 may also include information that is used to specify how to locate the proximate test structure and/or how to test the proximate test structure. In the illustrated embodiment, the resulting files 108 contain text files that indicate the start of each target image bitmap, an offset from each target structure to the actual test structure, a test structure type, and a measurement type. In a specific implementation, the specified test structure types include a post, a hole, a line or a trench. The measurement type specifies whether to measure an imaged test structure between the outer edges or the inner edges. The measurement type may also indicate a threshold value for such measurement.

A recipe 112 is then generated from the bitmap and text files 108 for a specific type of metrology tool in operation 110. The recipe 112 that is output from operation 110 contains simulated reference patterns which may later be used to accruately and automatically locate target patterns on a sample. Several specific embodiments of the recipe generation procedure 110 are described further below with reference to FIGS. 3 through 10.

Figure 2:
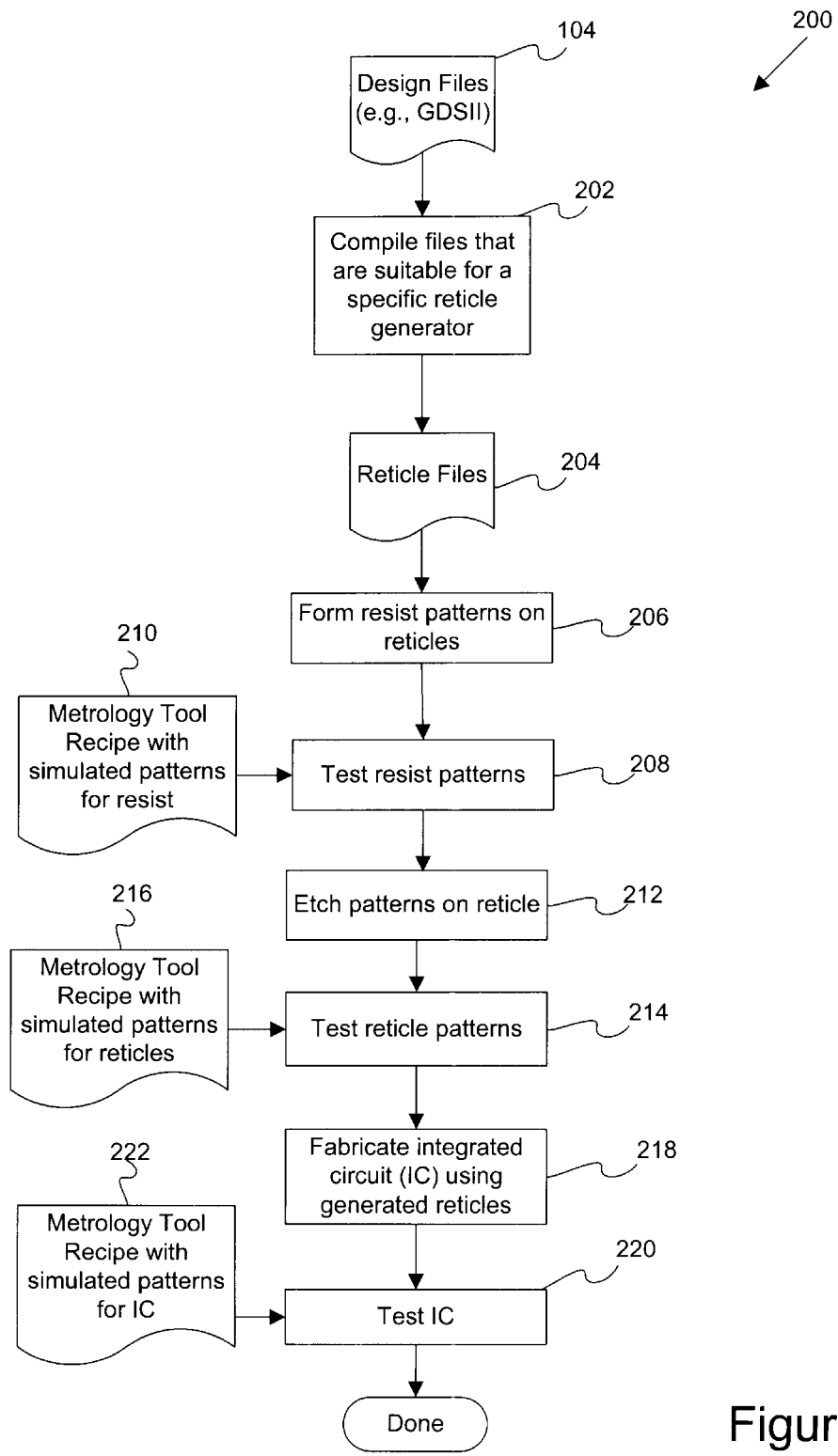
FIG. 2 is a flowchart illustrating a procedure for generating an integrated circuit (IC) in accordance with one embodiment of the present invention.

FIG. 2 is a flowchart illustrating a procedure 200 for generating an integrated circuit (IC) in accordance with one embodiment of the present invention. As shown further below, recipes having simulated reference patterns may be utilized during various stages of the IC process 200 to locate structures. Initially, the design files 104 are transcribed into a file format 204 that is suitable for reticle fabrication in operation 202. By way of examples, file formats that are suitable for reticle generation include a MEBES jobdeck. The above described CATS software may be used to generate the MEBES jobdeck. The reticle files 204 are then used to form resist patterns on reticles in operation 206. The resist patterns may then be tested in operation 208 using a metrology tool recipe 210 having reference patterns that simulate resist process effects and/or resist imaging effects, where the reference patterns are used to locate unique resist patterns proximate to the test structures.

The reticles may then be etched in operation 212 to form patterns on the reticle. The resist may also be removed in operation 212. The reticle patterns may then be tested in operation 214. A metrology tool recipe 216 having patterns that simulate reticle pattern fabrication effects and/or imaging effects may then be utilized to locate the reticle patterns in operation 214. The reticles may then be utilized to fabricate the IC in operation 218. The IC may then be tested in operation 220. A specific metrology tool recipe 222 having patterns that simulate IC process effects and/or imaging effects may be utilized during this test.

Any suitable search mechanism may be used to search for a target image that corresponds to the a particular reference image. In one embodiment, a normalized correlation technique is used to measure the pixel-to-pixel similarity between the target image and the reference image, irrespective of any linear differences in brightness. Mathematically, the correlation coefficient r of a reference image and a corresponding target reference image at an offset (u,v) is given by:

$$r(u,v) = \frac{\left[N\sum_i T_i R_i - \left(\sum_i T_i\right)\left(\sum_i R_i\right)\right]}{\sqrt{\left[N\sum_i T_i^2 - \left(\sum_i T_i\right)^2\right]\left[N\sum_i R_i^2 - \left(\sum_i R_i\right)^2\right]}}$$

where N is the total number of pixels, $T_i$ is the target image at $(u+x_i, v+y_i)$, and $R_i$ is the reference image at the relative offset $(x_i, y_i)$.

Figure 3:
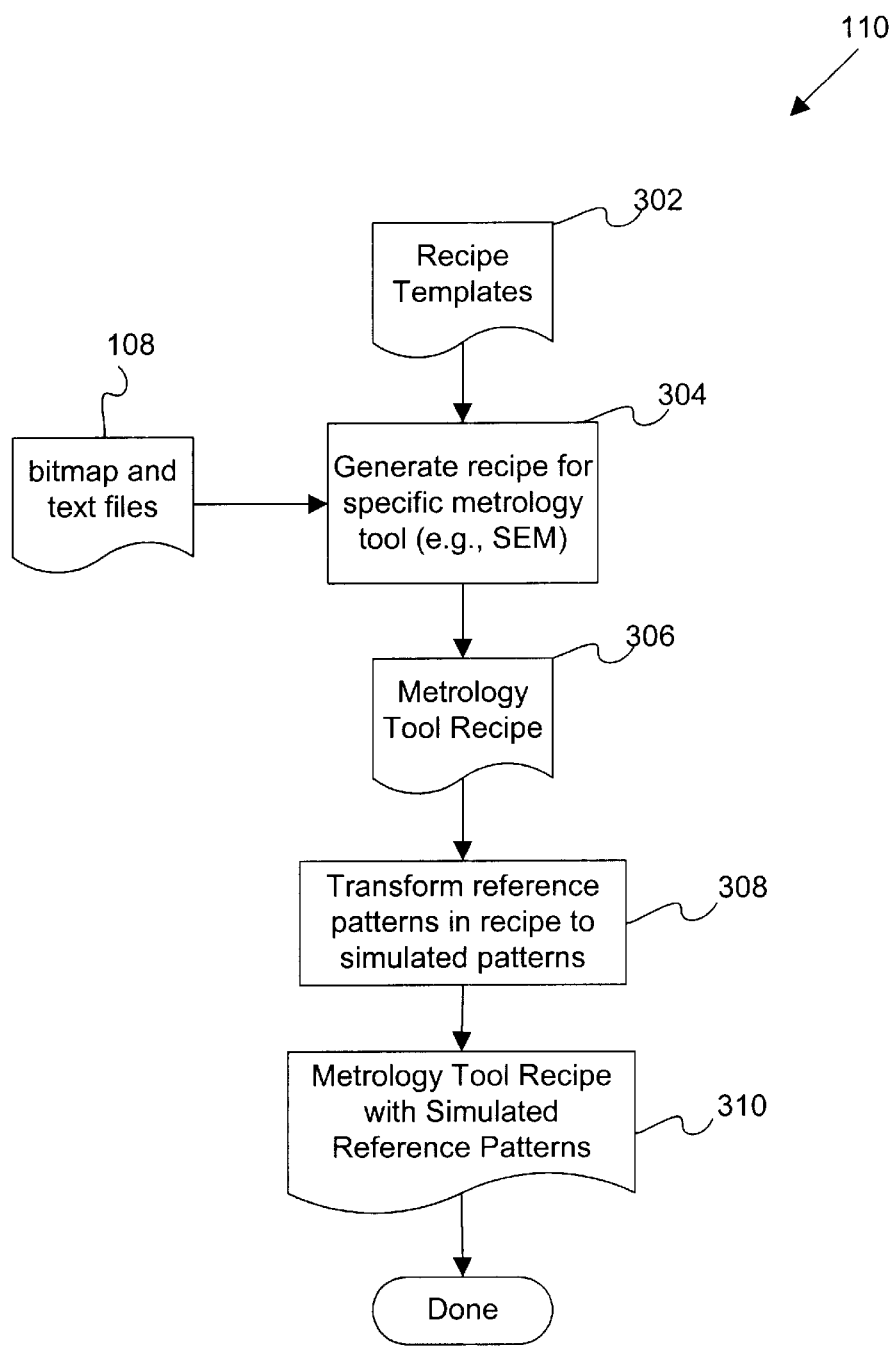
FIG. 3 is a flowchart illustrating the operation of FIG. 1 for generating a recipe having simulated reference patterns in accordance with one embodiment of the present invention.

FIG. 3 is a flowchart illustrating the operation 110 of FIG. 1 for generating a recipe having simulated reference patterns in accordance with one embodiment of the present invention. A recipe for a specific metrology tool may be generated in operation 304 based on one or more recipe templates 302 and bitmap patterns and text files 108 that are based on original design data. The bitmap patterns each represent a reference pattern which can be used to locate a corresponding target pattern on the sample. If the target pattern was fabricated and imaged without any process or imaging effects, the reference and target images would be identical. However, since process and imaging effects result in significant differences between the reference and corresponding target image, the reference patterns are altered to simulate at least one or more of these process and/or imaging effects. Accordingly, the bitmap reference patterns are transformed into simulated patterns to form a recipe in operation 308. The result is a metrology tool recipe with simulated reference patterns 310.

Figure 4:
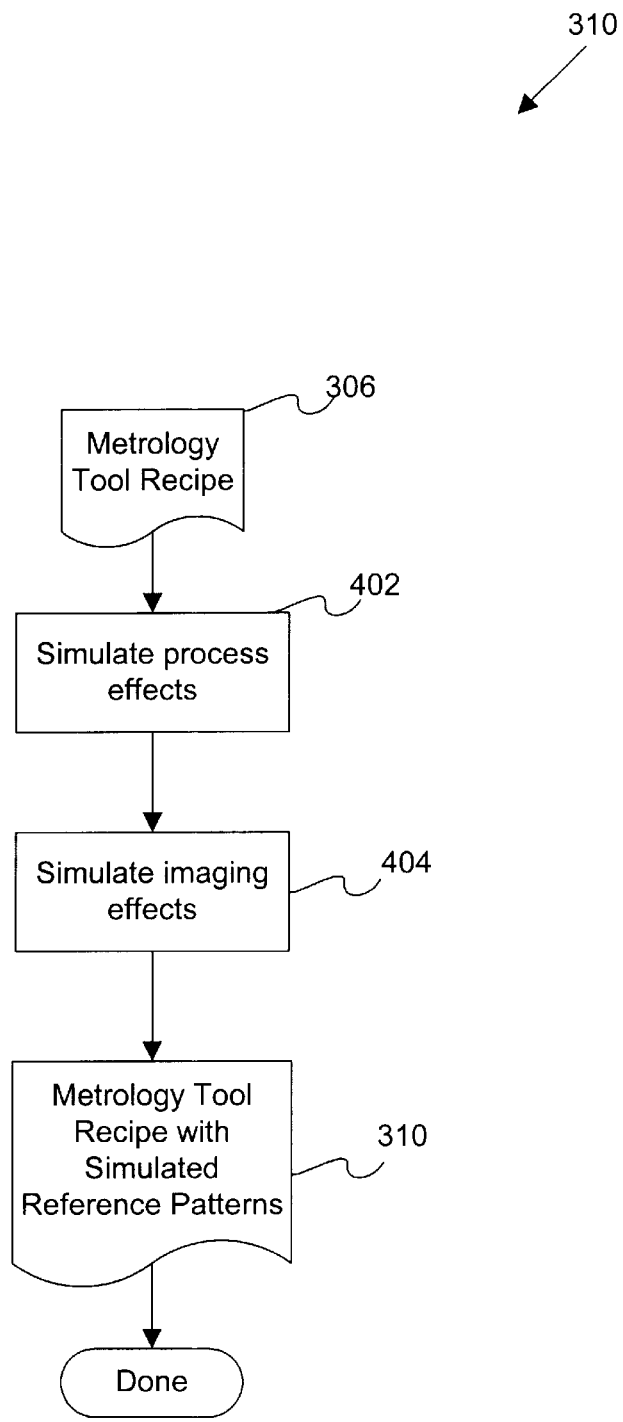
FIG. 4 is a flowchart illustrating the operation of FIG. 3 for transforming the reference patterns in the metrology tool recipe into simulated patterns in accordance with one embodiment of the present invention.

FIG. 4 is a flowchart illustrating the operation 310 of FIG. 3 for transforming the reference patterns in the metrology tool recipe into simulated patterns in accordance with one embodiment of the present invention. Initially, the reference patterns within the metrology tool recipe 306 are altered so as to simulate process effects in operation 402. The reference patterns are then altered again to simulate measurement or imaging effects in operation 404. Of course, the imaging effects may be simulated prior to or at the same time as the process effects. These simulations result in a metrology tool recipe with simulated reference patterns 310.

Any suitable process effects may be simulated. Preferably, the simulated process effects include feature tapering, corner rounding, and feature shrinkage. The simulated process effects may also include feature warping and edge roughening. Preferably, the simulated imaging effects include substrate and material contrast shifting, edge enhancement, and scan persistence. The simulated imaging effects may also include edge thickening and charge shadowing.

Figure 5A:
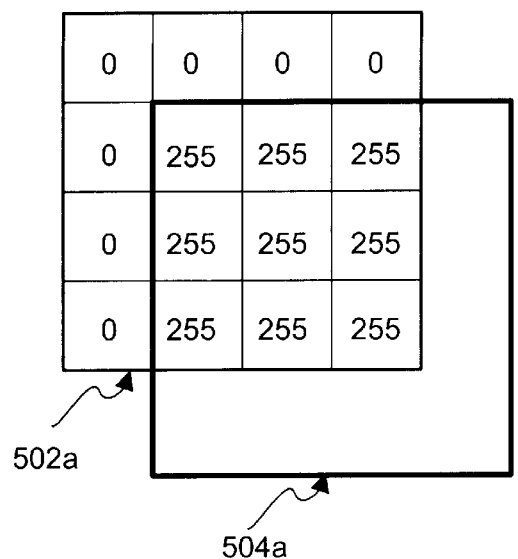
FIGS. 5A and 5B illustrate simulation of corner rounding in accordance with one embodiment of the present invention.
Figure 5B:
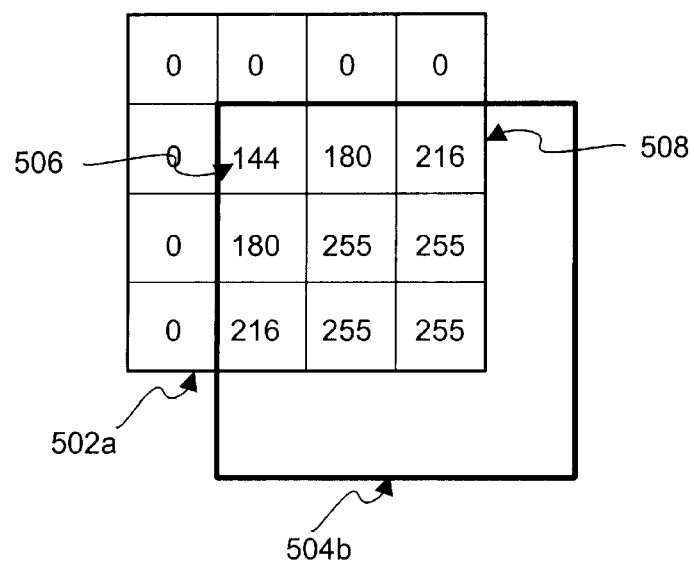

Any suitable technique may be utilized to simulate corner rounding. FIGS. 5A and 5B illustrate simulation of corner rounding in accordance with one embodiment of the present invention. As shown in FIG. 5A, a kernel or window 504a is initially formed around a corner of material or feature 502a. In the illustrated embodiment, the kernel is sized to encompass 16 pixels (four pixels wide and four pixels in length). Each pixel can have a brightness level between 0 (darkest) and 255 (brightest). For illustration purposes, the feature pixels have a maximum intensity value of 255 and the substrate pixels have a minimum intensity value of 0. Of course, the imaged feature may have a lower brightness level and may even appear darker relative to the substrate.

After the kernel 502a is centered over the feature corner 502a, the edges of the feature are located by determining where the pixels transition from 255 to 0. The edges of the corner are then darkened so as to simulate corner rounding. In one embodiment, the corner pixel is changed to a intensity value that is an average intensity of the pixels within the kernels. In the illustrated embodiment of FIG. 5B, the corner pixel 506 of the kernel 504b is changed to a value of 144. The pixels extending along the edges of the feature 502a from the corner 506 to the edge of the kernel 508 are changed to values that are increasingly less dark than the corner pixel. As shown in FIG. 5B, the pixels adjacent to the corner are changed to values of 180 and the pixels at the edge of the window are changed to values of 216. In this embodiment, each pixel from the corner to the kernel edge are increased in value by a substantially equal amount so that the kernel edge's pixel has a value that is less than the feature's original intensity value by the same equal amount. By gradually darkening the pixels from the edge of the kernel to the corner, the feature corner 502b becomes rounded.

Figure 6A:
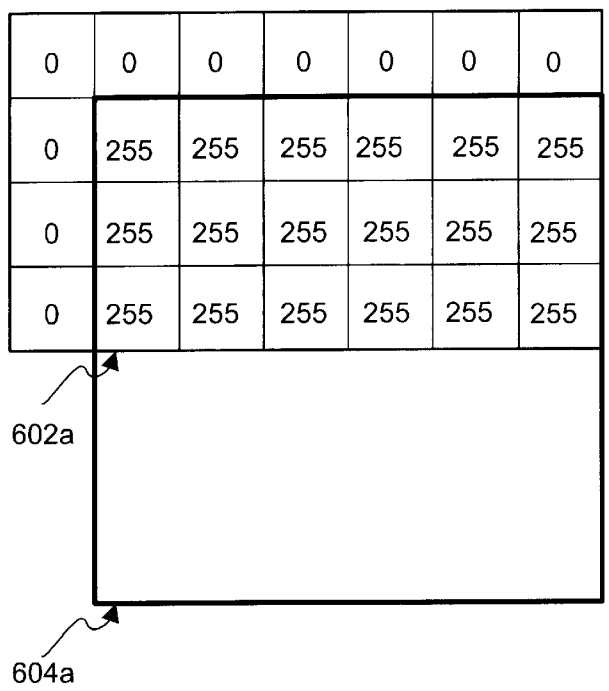
FIGS. 6A and 6B illustrate simulation of feature tapering in accordance with one embodiment of the present invention.
Figure 6B:
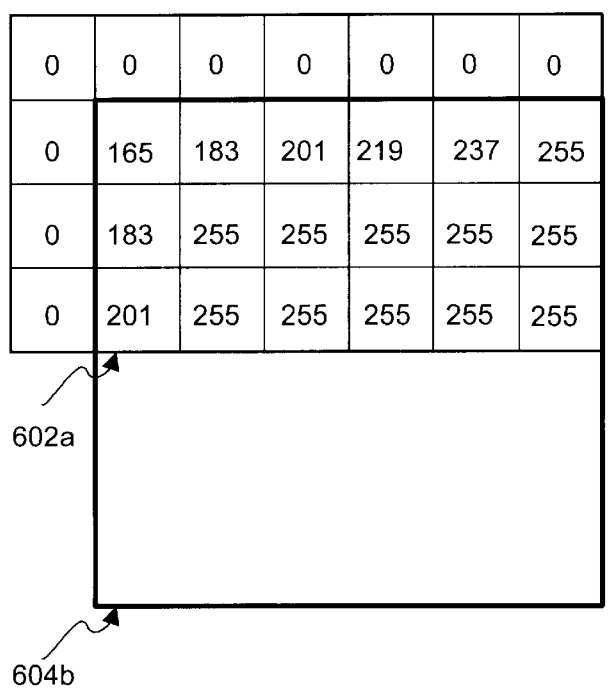

Likewise, any suitable technique may be used to simulate feature tapering. FIGS. 6A and 6B illustrate simulation of feature tapering on feature 602a in accordance with one embodiment of the present invention. The same general techniques are used for simulating feature tapering as shown above for corner rounding. However, the kernel 604a is enlarged, as compared with the kernel for corner rounding. Similar to the corner rounding technique, the corner pixel's intensity value is changed to the average pixel value for the kernel 604a. As shown in FIG. 6B, the corner pixel of kernel 604b is changed to a value of 165. The edge pixels are given increasingly larger pixel values that are less dark than the corner pixel. As shown, the edge pixels have values of 183, 201, 219, 237, and 255. That is, the edge pixels are gradually lightened from the corner to the kernel edge.

Figure 7A:
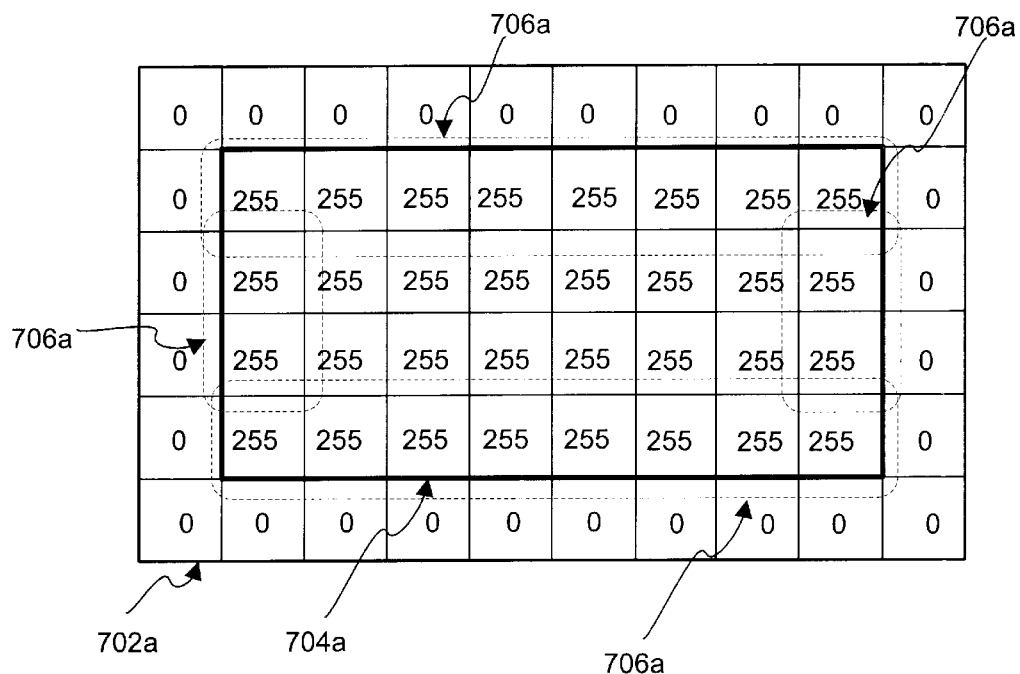
FIGS. 7A and 7B illustrate simulation of feature shrinkage in accordance with one embodiment of the present invention.
Figure 7B:
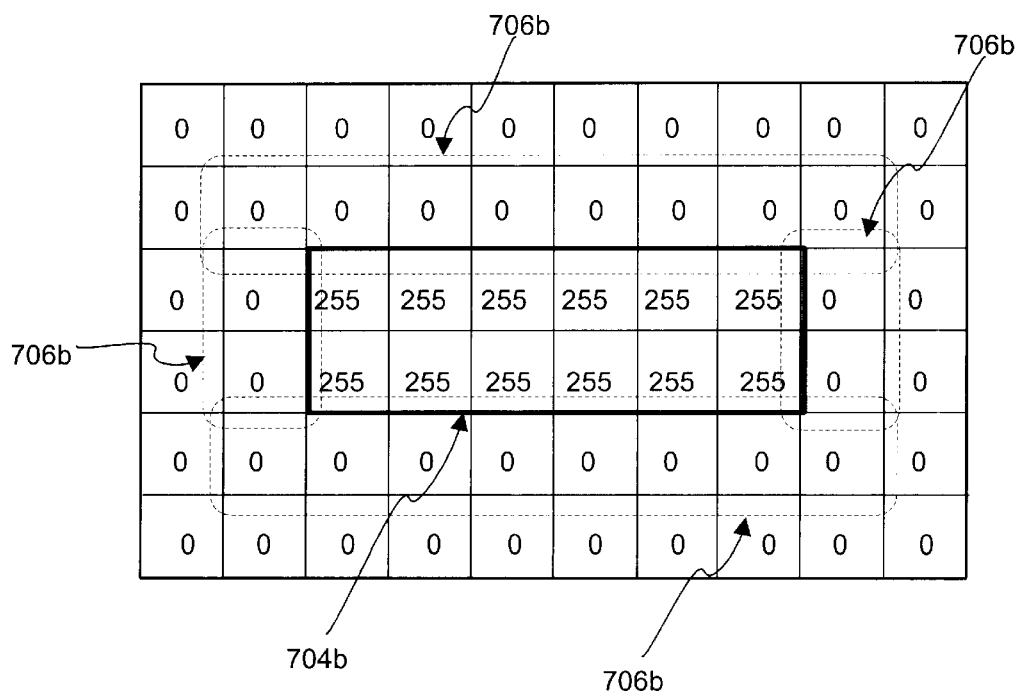

FIGS. 7A and 7B illustrate simulation of feature shrinkage in accordance with one embodiment of the present invention. As shown, in FIG. 7A, a material or feature 704a has a plurality of pixels with a particular intensity (i.e., 255) and a substrate with a different intensity (i.e., 0). The feature 704a has edges 706a. The edges are defined as the pixels that border pixels having a different intensity (i.e., 0). As shown in FIG. 7B, the edge pixels 706b are simply given the same intensity value as the substrate (i.e., 0). As a result of changes to the edge pixels' intensity values, the feature 704b has a smaller size. This same technique may easily be applied to features and substrates having various combinations of intensity values.

Any suitable techniques may be used for simulating imaging effects. FIGS. 8A through 8C illustrate simulation of edge enhancement and substrate and material (e.g., feature) contrasting, in accordance with one embodiment of the present invention. FIG. 8A shows a typical reference image of a material 806a having intensity 255 and substrate 802a having intensity 0. FIG. 8B shows an altered material 806b with an enhanced edge 804b. The edge 804b is enhanced by giving the pixels at the edge a brightest intensity value of 255. An edge pixel may be defined as a pixel of a first intensity that borders another pixel having a second intensity. The substrate 802b and non-edge material portion 806b are given an average intensity value of 128. Of course, any intensity values may be used to enhance the edge, as long as the edge 804b is given a significantly different value than the substrate and non-edge material portions 806b.

FIG. 8C shows simulation of substrate and material (e.g., feature) contrast. As shown, the substrate 802b is given any value that differs significantly from the non-edge material portions 806c. The material edge 804b is still enhanced. As shown, the substrate 802b has a value of 0; the non-edge material portion 806c a value of 150; and the edge 804b a value of 255. Of course, any suitable values may be used for the substrate, edge, and non-edge material portion.

FIGS. 9A and 9B show simulation of scan persistence in accordance with one embodiment of the present invention. Scan persistence usually occurs while imaging relatively long vertical structures (e.g., vertical with respect to the electron beam). The intensity of the feature is typically smeared on one side of the feature (e.g., along the scan direction of the electron beam). A material or feature 902 having no scan persistence is shown in FIG. 9A. As shown in FIG. 9B, a gradient of brightness is simulated to the right of the feature 902. That is, decreasing values of the brightness of the feature 902 are carried over to the columns (i.e., 904b, 906b, 908b, 910b, 912b, and 914b) to the right of feature 902.

Figure 10A:
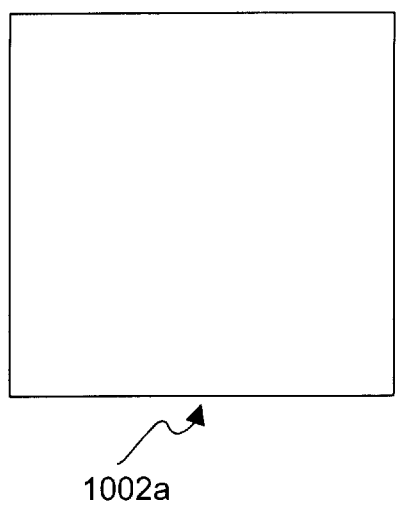
FIGS. 10A and 10B illustrate simulation of feature warpage in accordance with one embodiment of the present invention.
Figure 10B:
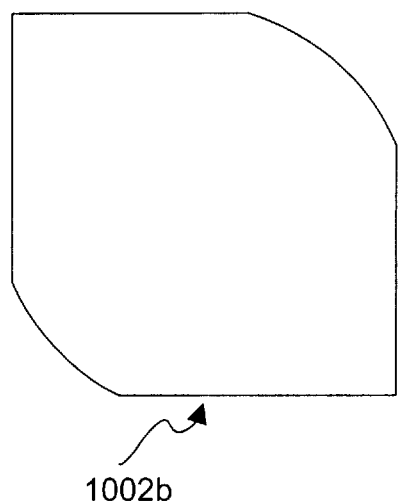

FIGS. 10A and 10B illustrate simulation of feature warpage in accordance with one embodiment of the present invention. A material or feature 1002a having no warpage is shown in FIG. 10A, and a feature 1002b having simulated warpage is shown in FIG. 10B. Warpage is similar to corner rounding, but it typically only occurs on two corners, instead of four. Thus, the above described corner rounding techniques may be applied to the northeast and southwest corners of features that are subject to warpage.

Each simulated process effect and simulated imaging effect are preferably associated with a degree parameter having a plurality of selectable values. In one embodiment, each process effect has five different degrees. Each degree value corresponds to a specific amount of the associated simulated process effect or imaging effect. For instance, corner rounding may have five degrees numbered one through five, where one represents the least amount of corner rounding that may occur and five represents the most corner rounding that may occur during fabrication of the corresponding structure. Corner rounding values two, three, and four represent increasing amounts of corner rounding between a value of one and a value of five.

For a particular process type and a particular type of metrology tool, different combinations of different degree parameter values for the processing and imaging effects are tried to determine which combination most accurately simulates the process and imaging effects of the particular process type and the particular type of metrology tool. In one specific implementation, combinations of different degree parameter values for each processing effect are analyzed to determine which combination most accurately simulates the process effect of the particular process type, and combinations of different degree parameter values for each imaging effect are analyzed separately to determine which combination most accurately simulates the imaging effect of the particular metrology tool.

Figure 11A:
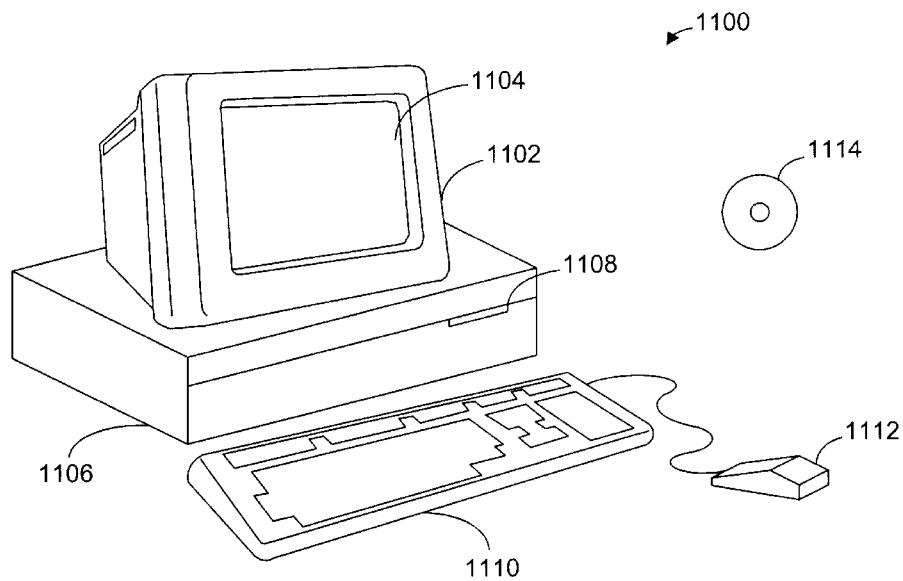
FIGS. 11A and 11B illustrate a computer system suitable for implementing embodiments of the present invention.
Figure 11B:
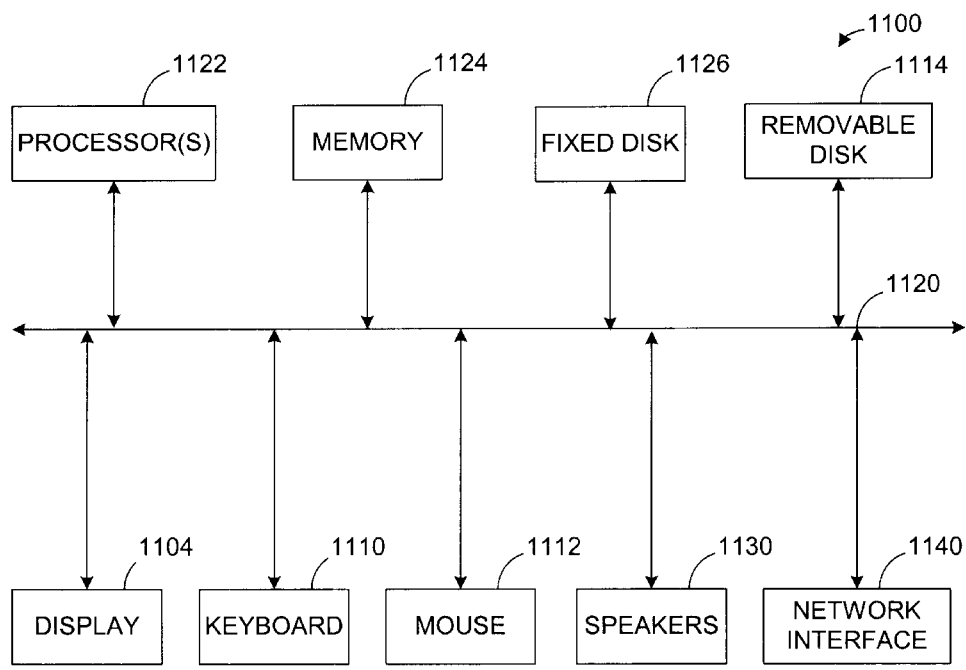

FIGS. 11A and 11B illustrate a computer system 1100 suitable for implementing embodiments of the present invention. FIG. 11A shows one possible physical form of the computer system. Of course, the computer system may have many physical forms ranging from an integrated circuit, a printed circuit board and a small handheld device up to a huge super computer. Computer system 1100 includes a monitor 1102, a display 1104, a housing 1106, a disk drive 1108, a keyboard 1110 and a mouse 1112. Disk 1114 is a computer-readable medium used to transfer data to and from computer system 1100.

FIG. 11B is an example of a block diagram for computer system 1100. Attached to system bus 1120 are a wide variety of subsystems. Processor(s) 1122 (also referred to as central processing units, or CPUs) are coupled to storage devices including memory 1124. Memory 1124 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1126 is also coupled bi-directionally to CPU 1122; it provides additional data storage capacity and may also include any of the computer-readable media described below. Fixed disk 1126 may be used to store programs, data and the like and is typically a secondary storage medium (such as a hard disk) that is slower than primary storage. It will be appreciated that the information retained within fixed disk 1126, may, in appropriate cases, be incorporated in standard fashion as virtual memory in memory 1124. Removable disk 1114 may take the form of any of the computer-readable media described below.

CPU 1122 is also coupled to a variety of input/output devices such as display 1104, keyboard 1110, mouse 1112 and speakers 1130. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1122 optionally may be coupled to another computer or telecommunications network using network interface 1140. With such a network interface, it is contemplated that the CPU might receive information from the network, or might output information to the network in the course of performing the above-described method steps. Furthermore, method embodiments of the present invention may execute solely upon CPU 1122 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. The invention may also be embodied in a carrier wave travelling over an appropriate medium such as airwaves, optical lines, electric lines, etc. Examples of program instructions include both machine code, such as produced by a compiler, and files containing higher level code that may be executed by the computer using an interpreter.

Although the foregoing invention has been described in some detail for purposes of clarity of understanding, it will be apparent that certain changes and modifications may be practiced within the scope of the appended claims. For example, although in the illustrated embodiments, the reference images are altered to simulate processing and/or imaging effects, the target image may instead be altered by easily reversing the above described simulation techniques so as to remove processing and/or imaging effects. Therefore, the described embodiments should be taken as illustrative and not restrictive, and the invention should not be limited to the details given herein but should be defined by the following claims and their full scope of equivalents.

What is claimed is:

1. A method of generating a test recipe for a metrology tool, the method comprising:

providing a plurality of first reference images that are designed to be used to fabricate a plurality of structures on a sample, each of the plurality of structures being imageable to form a plurality of target image patterns; and generating or modifying a test recipe for use by a metrology tool in locating the structures on the sample, wherein generating or modifying the test recipe includes forming a plurality of second references images from at least some of the first reference images and associating the second reference images with the test recipe, the second reference images being formed to at least partially simulate one or more process effect(s) associated with fabricating the structures of the sample.

2. A method as recited in claim 1, wherein the process effects include feature tapering, corner rounding, and feature shrinkage.

3. A method as recited in claim 2, wherein the process effects further include feature warping and edge roughening.

4. A method as recited in claim 1, the second reference images being formed to at least partially simulate one or more imaging effect(s) associated with obtaining the target images from the metrology tool.

5. A method as recited in claim 4, wherein the imaging effects include substrate and material contrast, edge enhancement, and scan persistence.

6. A method as recited in claim 5, wherein the imaging effects further include edge thickening and charge shadowing.

7. A method as recited in claim 2, wherein the second reference images are formed to also simulate imaging effects associated with obtaining the target images from the metrology tool.

8. A method as recited in claim 7, wherein the imaging effects include substrate and material contrast, edge enhancement, and scan persistence.

9. A method as recited in claim 8, wherein each simulated process effect and simulated imaging effect are associated with a degree parameter having a plurality of selectable values and each degree parameter value corresponds to a specific amount of the associated simulated process effect or imaging effect, the method further comprising:

for a particular process type and a particular type of metrology tool, analyzing a plurality of combinations of different degree parameter values for each processing and imaging effect to determine which combination most accurately simulates the process and imaging effects of the particular process type and the particular type of metrology tool, respectively.

10. A method as recited in claim 9, wherein the analysis is accomplished by:

analyzing a plurality of combinations of different degree parameter values for each processing effect to determine which combination most accurately simulates the process effect of the particular process type; and analyzing a plurality of combinations of different degree parameter values for each imaging effect to determine which combination most accurately simulates the imaging effect of the particular metrology tool, wherein the processing effect combinations are analyzed separately from the imaging effects.

11. A method as recited in claim 1, wherein the metrology tool is a scanning electron microscope designed to measure and/or inspect samples selected from a group consisting of a reticle and an integrated circuit and the structures are selected from a group consisting of integrated circuit structures, resist pattern structures utilizable for fabricating integrated circuit structures, reticle structures, and resist pattern structures utilizable for fabricating reticle structures.

12. A method as recited in claim 1, wherein locating the structures on the sample is accomplished by a pixel based search.

13. A method as recited in claim 1, wherein locating the structures on the sample is accomplished by a geometric feature based search.

14. A method as recited in claim 1, wherein locating the structures on the sample is accomplished by finding a first structure on the sample that is significantly correlated with a first one of the second reference images.

15. A method as recited in claim 1, wherein each reference image is associated with an offset value from the corresponding target image to a test structure which is to be tested and information regarding how to test the test structure.

16. A method as recited in claim 15, wherein the information includes a test structure type and a measurement type.

17. A method as recited in claim 16, wherein the test structure type specifies whether the test structure is a hole, a post, a line, or a trench and the measurement type specifies whether to measure from the inside edges or the outside edges of such test structure.

18. A computer system operable to generate a test recipe for a metrology tool, the computer system comprising:
  one or more processors;
  one or more memory, wherein at least one of the processors and memory are together operable to:
    provide a plurality of first reference image patterns that are designed to be used to fabricate a plurality of structures on a sample, each of the plurality of structures being imageable to form a plurality of target image patterns; and
    generate or modify a test recipe for use by a metrology tool in locating the structures on the sample, wherein generating or modifying the test recipe includes forming a plurality of second references images from the first reference images and associating the second reference images with the test recipe, the second reference images being formed to at least partially simulate one or more process effect(s) associated with fabricating the structures of the sample.

19. A computer system as recited in claim 18, wherein the process effects include feature tapering, corner rounding, and feature shrinkage.

20. A computer system as recited in claim 18, the second reference images being formed to at least partially simulate one or more imaging effect(s) associated with obtaining the target images from the metrology tool.

21. A computer system as recited in claim 20, wherein the imaging effects include substrate and material contrast shifting, edge enhancement, and scan persistence.

22. A computer system as recited in claim 19, wherein the second reference images are formed to also simulate imaging effects associated with obtaining the target images from the metrology tool.

23. A computer system as recited in claim 22, wherein the imaging effects include substrate and material contrast shifting, edge enhancement, and scan persistence.

24. A computer system as recited in claim 23, wherein each simulated process effect and simulated imaging effect are associated with a degree parameter having a plurality of selectable values and each degree parameter value corresponds to a specific amount of the associated simulated process effect or imaging effect, wherein at least one of the processors and memory are further adapted to:
  for a particular process type and a particular type of metrology tool, analyze a plurality of combinations of different degree parameter values for each processing and imaging effect to determine which combination most accurately simulates the process and imaging effects of the particular process type and the particular type of metrology tool, respectively.

25. A computer system as recited in claim 24, wherein the analysis is accomplished by:
  analyzing a plurality of combinations of different degree parameter values for each processing effect to determine which combination most accurately simulates the process effect of the particular process type; and
  analyzing a plurality of combinations of different degree parameter values for each imaging effect to determine which combination most accurately simulates the imaging effect of the particular metrology tool,
  wherein the processing effect combinations are analyzed separately from the imaging effects.

26. A computer system as recited in claim 18, wherein the metrology tool is a scanning electron microscope designed to measure and/or inspect samples selected from a group consisting of a reticle and an integrated circuit and the structures are selected from a group consisting of integrated circuit structures, resist pattern structures utilizable for fabricating integrated circuit structures, reticle structures, and resist pattern structures utilizable for fabricating reticle structures.

27. A computer system as recited in claim 18, wherein locating the structures on the sample is accomplished by a pixel based search.

28. A computer system as recited in claim 18, wherein locating the structures on the sample is accomplished by finding a first structure on the sample that is significantly correlated with a first one of the second reference images.

29. A computer program product for generating a test recipe for a metrology tool, the computer program product comprising:
  at least one computer readable medium;
  computer program instructions stored within the at least one computer readable product configured to cause a combining device to:
    provide a plurality of first reference image patterns that are designed to be used to fabricate a plurality of structures on a sample, each of the plurality of structures being imageable to form a plurality of target image patterns; and
    generate or modify a test recipe for use by a metrology tool in locating the structures on the sample, wherein generating or modifying the test recipe includes forming a plurality of second references images from the first reference images and associating the second reference images with the test recipe, the second reference images being formed to at least partially simulate one or more process effect(s) associated with fabricating the structures of the sample.

30. A computer program product as recited in claim 29, wherein the process effects include feature tapering, corner rounding, and feature shrinkage.

31. A computer program product as recited in claim 30, wherein the second reference images are formed to also simulate imaging effects associated with obtaining the target images from the metrology tool.

32. A computer program product as recited in claim 31, wherein the imaging effects include substrate and material contrast shifting, edge enhancement, and scan persistence.

* * * * *